(12) United States Patent
Eagle et al.

(10) Patent No.: US 10,109,975 B2
(45) Date of Patent: Oct. 23, 2018

(54) MODULE PLACEMENT APPARATUS (71) Applicant: International Business Machines Corporation, Armonk, NY (US)

(72) Inventors: Jason R. Eagle, Kasson, MN (US); Roger D. Hamilton, Rochester, MN (US); Brian E. Hanrahan, Red Hook, NY (US); Robert K. Mullady, Highland, NY (US); Enrico A. Romano, Poughkeepsie, NY (US); Yuet-Ying Yu, Hopewell Junction, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 282 days.

(21) Appl. No.: 14/938,408

(22) Filed: Nov. 11, 2015

(65) Prior Publication Data
US 2017/0133810 A1    May 11, 2017

(51) Int. Cl.
*H01R 43/20* (2006.01)
*B25B 27/00* (2006.01)
(Continued)

(52) U.S. Cl.
CPC .......... *H01R 43/205* (2013.01); *B25B 27/00* (2013.01); *H01R 43/22* (2013.01);
(Continued)

(58) Field of Classification Search
CPC .. H01R 43/205; H01R 43/22; H05K 13/0007; H05K 13/0053; H05K 13/0447;
(Continued)

(56) References Cited

U.S. PATENT DOCUMENTS 4,583,287 A * 4/1986 McDevitt ........... H05K 13/0491
29/278
4,615,110 A * 10/1986 Crone ................ H05K 13/0491
29/741
(Continued)

OTHER PUBLICATIONS

Anonymous, "A Tool to Insert or Remove a Land Grid Array Package from a Socket", IPCOM000101587 Mar. 16, 2005; 3 pages.
(Continued)

*Primary Examiner* — Peter DungBa Vo
*Assistant Examiner* — Joshua D Anderson
(74) *Attorney, Agent, or Firm* — Cantor Colburn LLP (57) ABSTRACT

A module placement apparatus is provided and includes alignment brackets and a module placement tool. The alignment brackets include first guidance features, define an interior and are disposable aside an array of contacts. The module placement tool is insertible into the interior in first and second stages and includes a frame, a module gripping element operably supported on the frame, second guidance features engageable with the first guidance features at a conclusion of the first stage to maintain a relative orientation of the array of contacts and the frame during the second stage, and a gimbaled handle coupled to the module gripping element to maintain the relative orientation during the first stage until at least first and second guidance feature engagement.

9 Claims, 8 Drawing Sheets (51) Int. Cl.
*H01R 43/22* (2006.01)
*H05K 13/04* (2006.01)

(52) U.S. Cl.
CPC ..... *H05K 13/0447* (2013.01); *H05K 13/0491* (2013.01); *Y10T 29/53257* (2015.01)

(58) Field of Classification Search
CPC .......... H05K 13/0491; Y10T 29/53257; Y10T 29/53283; Y10T 29/53909; Y10T 29/53913; Y10T 29/53943; B25B 27/00
See application file for complete search history.

(56) References Cited

U.S. PATENT DOCUMENTS

| | | | | |
|---|---|---|---|---|
| 4,866,838 | A * | 9/1989 | Porter | H05K 13/0491 29/741 |
| 5,290,193 | A | 3/1994 | Goff et al. | |
| 5,446,960 | A | 9/1995 | Isaacs et al. | |
| 5,842,261 | A * | 12/1998 | Ortiz | B25B 27/023 29/260 |
| 6,711,810 | B2 | 3/2004 | Buley et al. | |
| 7,118,385 | B1 | 10/2006 | Bodenweber et al. | |
| 7,182,607 | B2 | 2/2007 | Huang et al. | |
| 7,392,582 | B2 * | 7/2008 | Hoppe | G01R 31/2893 29/739 |
| 2004/0192102 | A1 * | 9/2004 | Burton | H01L 24/75 439/374 |
| 2011/0017342 | A1 * | 1/2011 | Houser | D07B 7/18 140/123 |
| 2013/0263444 | A1 * | 10/2013 | Lo | B25B 9/00 29/764 |
| 2015/0022226 | A1 | 1/2015 | Barabi et al. | |
| 2015/0118894 | A1 | 4/2015 | Huang et al. | |

OTHER PUBLICATIONS

Anonymous, "Land Grid Array Socket Design for Minimizing Pin Damage During Device Insertion and Removal", IPCOM000169628D Apr. 24, 2008; 8 pages.

\* cited by examiner

MODULE PLACEMENT APPARATUS

BACKGROUND

The present invention relates to integrated circuit device mounting assemblies and, more specifically, to a module placement apparatus for implementing self-centering capabilities.

Area array socket connectors are an evolving technology in which an electrical interconnection between mating surfaces is formed. One significant application of this technology is the socketing of LGA modules directly to a socket of a printed wiring board (PWB) or a printed circuit board (PCB). In such cases, electrical connections are achieved by alignments of the contact arrays of the two mating surfaces and, in some cases, an interposer. Once the alignments are achieved, mechanical compression completes the assembly. LGA socket assemblies are prevalent today in the electronics industry, and are commonly used to attach both single chip modules (SCMs) and multi-chip modules (MCMs) to printed wiring boards.

Frequently, the alignments of the contact arrays and the mechanical compression are completed manually or with the assistance of tooling. In general, however, an operator is required to control the plane at which the LGA modules are placed whether the operator has tooling available or handles the connection processes entirely manually. For example, in the manual case, the operator handles the LGA modules and visually centers them until they can be pushed into or toward the PWB or the PCB. This process can lead to damage of socket contacts or the housing of the LGA modules due to the LGA modules being placed at an angle relative to a plane of the socket. In such instances, damage to the LGA site may result and require parts of or the entire assembly to be reworked.

SUMMARY

According to an embodiment of the present invention, a module placement apparatus is provided and includes alignment brackets and a module placement tool. The alignment brackets include first guidance features, define an interior and are disposable aside an array of contacts. The module placement tool is insertible into the interior in first and second stages and includes a frame, a module gripping element operably supported on the frame, second guidance features engageable with the first guidance features at a conclusion of the first stage to maintain a relative orientation of the array of contacts and the frame during the second stage, and a gimbaled handle coupled to the module gripping element to maintain the relative orientation during the first stage until at least first and second guidance feature engagement.

According to another embodiment of the present invention, a module placement apparatus is provided and includes alignment brackets and a module placement tool. The alignment brackets include first guidance features, define an interior and are disposable aside an array of contacts. The module placement tool is insertible into the interior in first and second stages and includes a frame, a module gripping element operably supported on the frame, second guidance features engageable with the first guidance features at a conclusion of the first stage to maintain a relative orientation of the array of contacts and the frame during the second stage and a ring-shaped gimbaled handle coupled to the module gripping element to provide the frame with at least one degree of self-centering freedom for maintaining the relative orientation during the first stage until at least first and second guidance feature engagement.

According to another embodiment of the present invention, a module placement apparatus is provided and includes alignment brackets and a module placement tool. The alignment brackets include first guidance features, define an interior and are disposable aside an array of contacts. The module placement tool is insertible into the interior in first and second stages and includes a frame, a module gripping element operably supported on the frame, second guidance features engageable with the first guidance features at a conclusion of the first stage to maintain a relative orientation of the array of contacts and the frame during the second stage and a gimbaled handle. The gimbaled handle includes a shaft and a bearing to couple the shaft to the module gripping element with at least two degrees of self-centering freedom for maintaining the relative orientation during the first stage until at least first and second guidance feature engagement.

Additional features and advantages are realized through the techniques of the present disclosure. Other embodiments and aspects of the disclosure are described in detail. For a better understanding of embodiments of the disclosure, refer to the description and to the drawings.

BRIEF DESCRIPTION OF THE DRAWINGS

Features characterizing embodiments of the present disclosure are described in the specification and claims which follow. These features, and advantages of embodiments of the disclosure are apparent from the following detailed description taken in conjunction with the accompanying drawings in which:

DETAILED DESCRIPTION

As will be described below, a tool is provided that enables an operator to place a processor module into position without causing damage to contacts or to the housing of the processor module.

Figure 1:
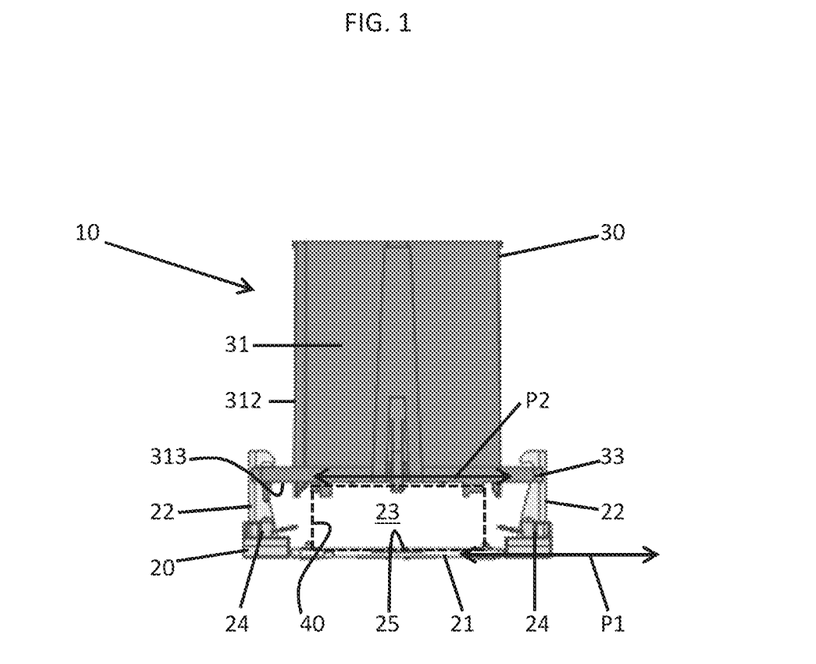
FIG. 1 is a side view of a module placement apparatus including alignment brackets and a module placement tool in accordance with an embodiment.
Figure 2:
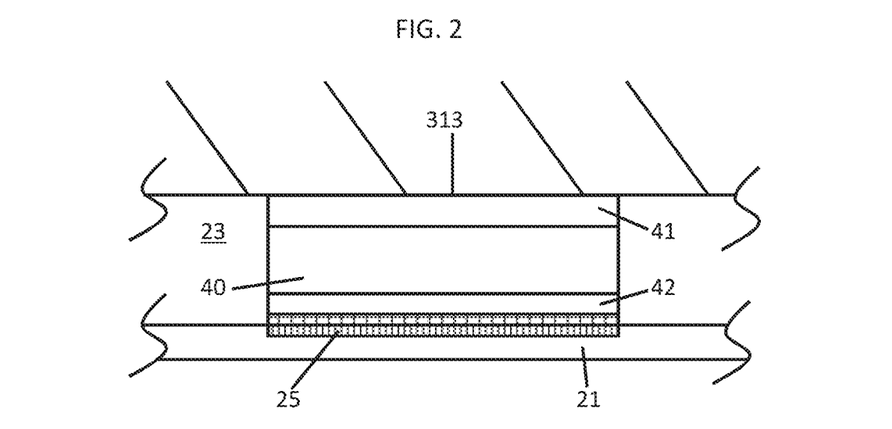
FIG. 2 is an enlarged view of a portion of the module placement apparatus of FIG. 1 with a processor module included therein.

With reference now to FIGS. 1 and 2 and with additional reference to FIGS. 3-5 or FIGS. 6-8, an embodiment of a module placement apparatus 10 is provided. The module placement apparatus 10 includes alignment brackets 20 and a module placement tool 30. The alignment brackets 20 are disposable on either side of an LGA interposer 21 that extends along a first plane P1 and include latches 22 that capture a heatsink load when a heatsink is installed. The latches 22 extend away from the first plane P1 in similar directions to define an interior region 23 above the LGA interposer 21. The alignment brackets 20 further include first guidance features 24 that are provided at or proximate to the latches 22 and the LGA interposer 21 includes an array of contacts 25. The array of contacts 25 is generally disposed at a central region of the LGA interposer 21 and extends along the first plane P1. The module placement tool 30 is insertible into the interior region 23 in an insertion process having at least a first insertion stage and a second insertion stage.

The module placement tool 30 includes a frame 31, a module gripping element 32, which is operably supported on the frame 31, second guidance features 33 and a gimbaled handle 34 (not shown in FIG. 1). The frame 31 includes an outer frame 310 and an inner frame 311. The outer frame 310 may be provided with a box-shape and has sidewalls 312 and a lower surface 313, which closes a bottom portion of the frame 31, and an open top. The sidewalls 312 and the lower surface 313 thus form an open-topped, box-shaped interior in which the inner frame 311, the module gripping element 32 and the gimbaled handle 34 are partially disposed.

As shown in FIG. 1, the first guidance features 24 extend upwardly from the first plane P1 such that they are configured to engage with the second guidance features 33. The second guidance features 33 include flanges that extend outwardly from the sidewalls 312 and extensions that extend from a second plane P2 of the lower surface 313. The second guidance features 33 are thus engageable with the first guidance features 24 at a conclusion of the first insertion stage to thereby maintain a relative orientation of the array of contacts 25 and the frame 31 (i.e., the second plane P2 of the lower surface 313) during the second insertion stage. The gimbaled handle 34 is coupled to the module gripping element 32 and is configured to maintain the relative orientation of the array of contacts 25 and the frame 31 during the first stage until at least the first guidance features 24 engage with the second guidance features 33.

The module placement apparatus 10 may further include a processor module 40. The processor module 40 is interposable between the lower surface 313 and the array of contacts 25. The processor module 40 has an upper portion 41 and a lower portion 42. The upper portion 41 is configured to be gripped by the module gripping element 32 of the module placement tool 30 such that the processor module 40 can be lifted, moved and positioned with respect to the alignment brackets 20. The lower portion 42 includes electrical contacts that are respectively connectable with corresponding ones of the array of contacts 25.

In accordance with embodiments, the relative orientation of the array of contacts 25 and the frame 31 is characterized in that the second plane P2 of the lower surface 313 is maintained in a parallel condition with respect to the first plane P1. As such, with the gimbaled handle 34 being coupled to the module gripping element 32 and thus configured to maintain the relative orientation of the array of contacts 25 and the frame 31 (i.e., the parallel condition) during the first insertion stage until at least the first guidance features 24 engage with the second guidance features 33, a possibility that the lower surface 313 will impact the processor module 40 at an angle or an offset location is decreased. Therefore, since such angled or offset impacts may lead to damage of the array of contacts, the decreased possibility of angled or offset impacts may lead to a decreased incidence of damage.

Figure 4:
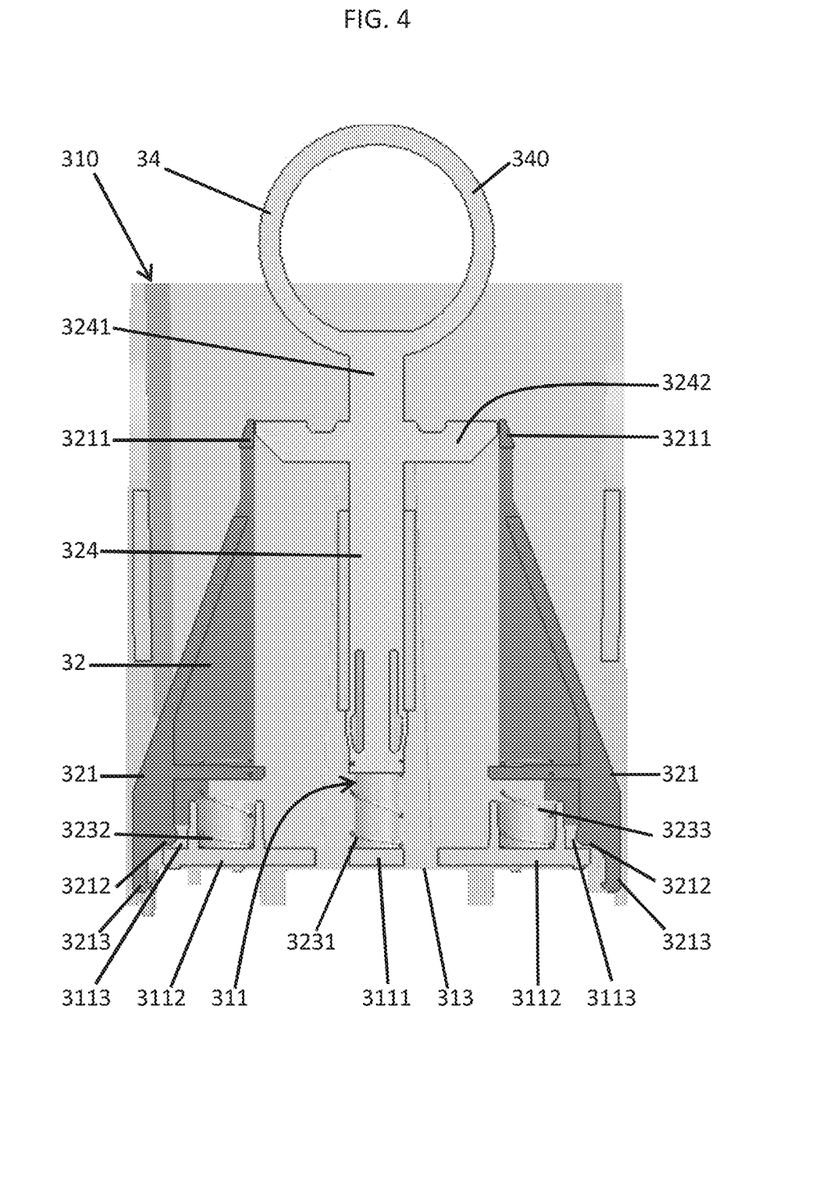
FIG. 4 is a cutaway side view of the module placement apparatus of FIG. 3.
Figure 5:
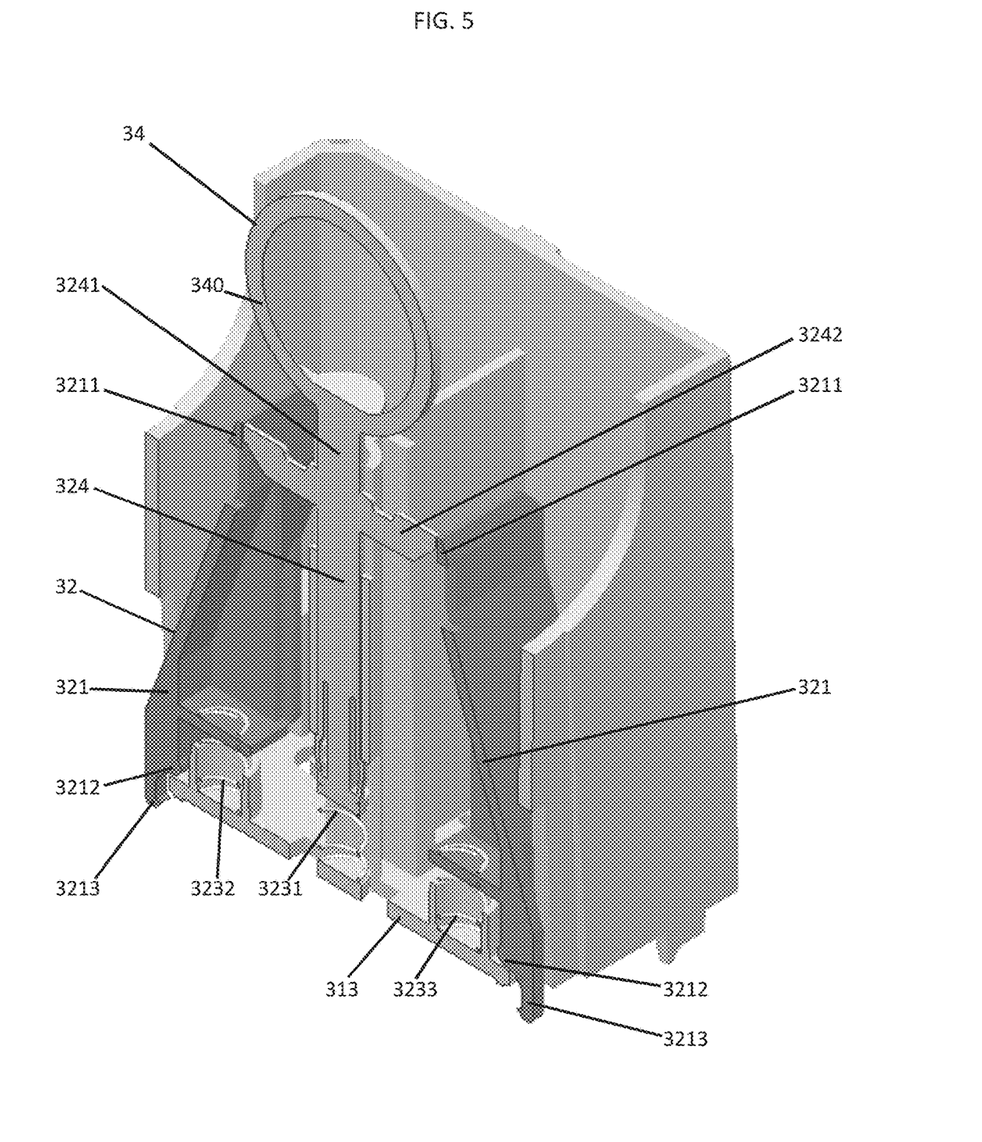
FIG. 5 is a cutaway perspective view of the module placement apparatus of FIG. 3.
Figure 7:
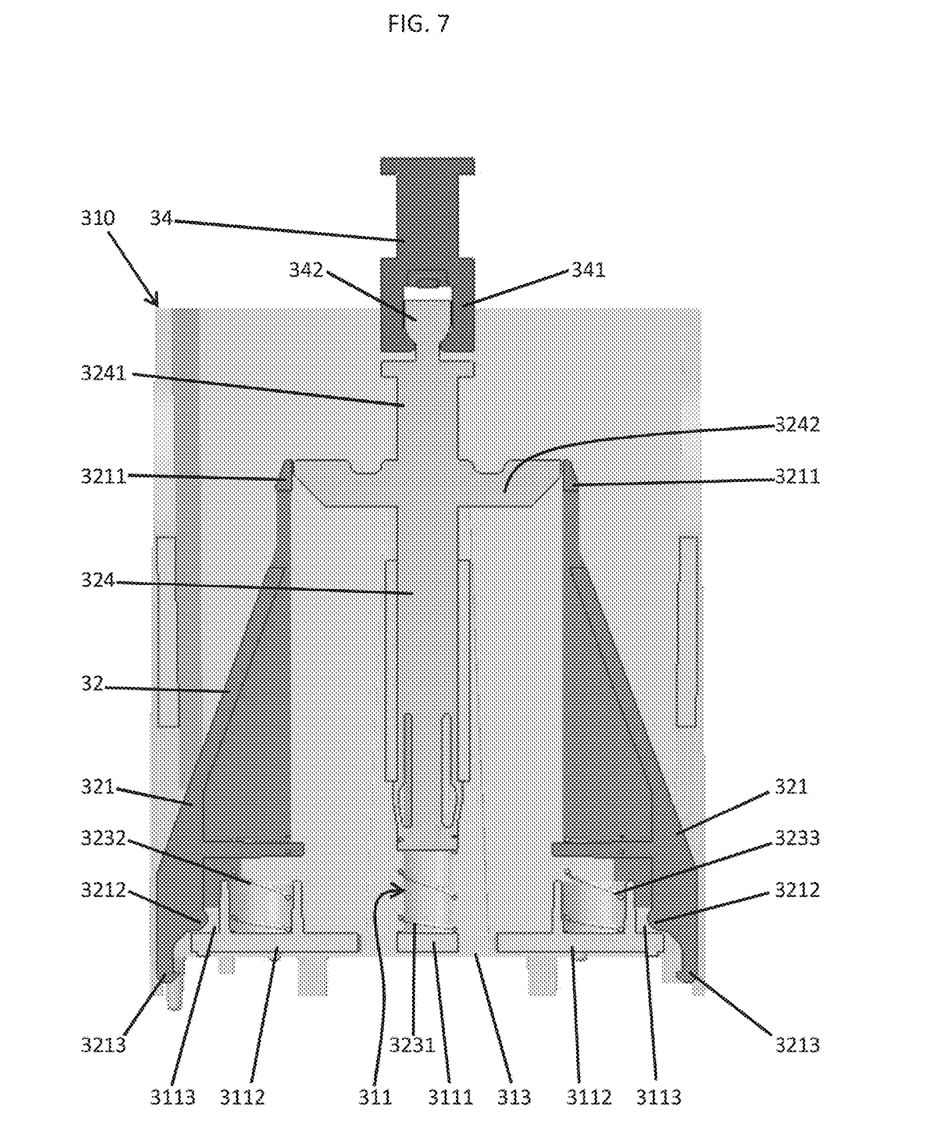
FIG. 7 is a cutaway side view of the module placement apparatus of FIG. 6.
Figure 8:
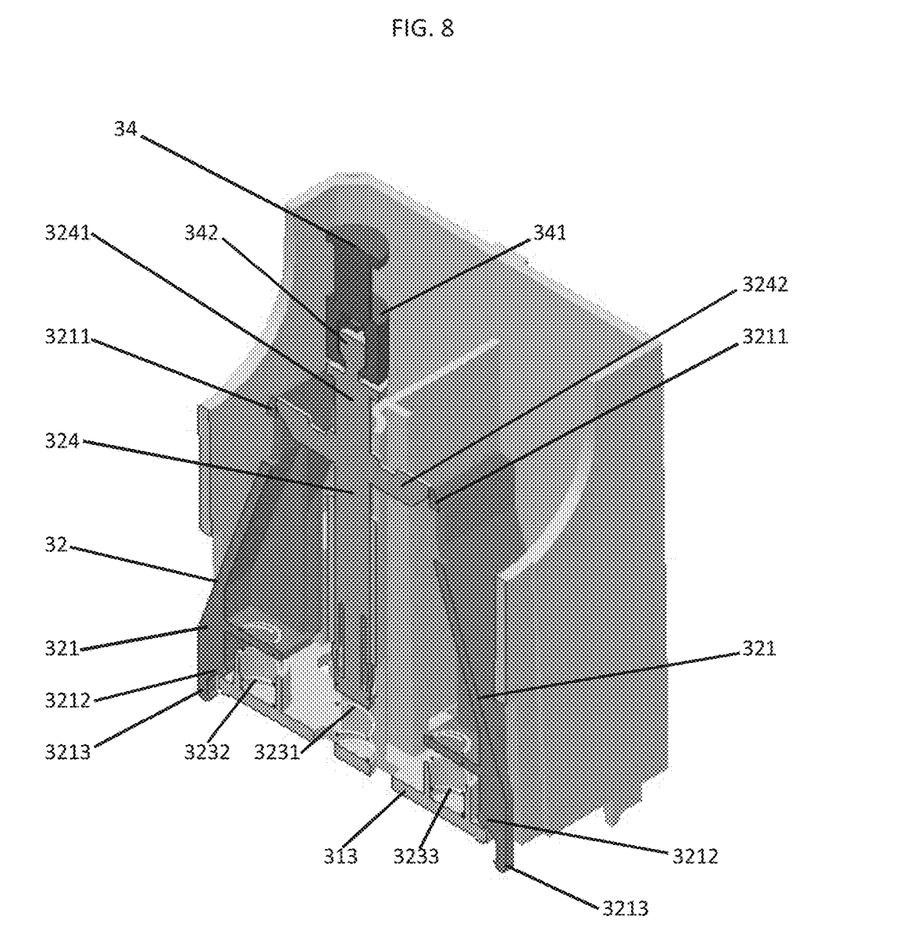
FIG. 8 is a cutaway perspective view of the module placement apparatus of FIG. 6.

As shown in FIGS. 4 and 5 and in FIGS. 7 and 8, the inner frame 311 is disposed within the open-topped, box-shaped interior of the outer frame 310 to be supportive of the module gripping element 32. In this way, the inner frame 311 may include a central region 3111, lateral regions 3112 and hinges 3113. The module gripping element 32 may include first and second pivotable and spring-loaded gripping devices 321, which are supportively disposable at the lateral regions 3112, first, second and third elastic elements 3231, 3232 and 3233, which are anchored in the central region 3111 and in the lateral regions 3112, respectively, and a spring-loaded actuator 324 that is supportively disposable in the central region 3111.

The first and second pivotable and spring-loaded gripping devices 321 face each other in opposite directions within the open-topped, box-shaped interior of the outer frame 310 and are actuatable to assume at least a module accepting open position and a module engaged closed position. To this end, each includes a latch element 3211, a wing-shaped body that increases in width with increasing distance from the latch element 3211, a hinge portion 3212 that is hinge-coupled to the corresponding lateral region 3112 and includes a hinge-portion flange and a hook portion 3213. The hinge-portion flanges are each connected to the corresponding ones of the second and third elastic elements 3232 and 3233 such that the first and second pivotable and spring-loaded gripping devices 321 are biased to pivot about the hinge-portion flanges toward one another (i.e., inwardly) and toward bringing the module gripping element 32 into assumption of the module accepting open position.

The hook portion 3213 extends from the hinge portion 3212 and through the lower surface 313 and includes a distal hook feature. With the module gripping element 32 assuming the module engaged closed position, this distal hook feature grips onto complementary recessions defined in the upper portion 41 of the processor module 40.

The spring-loaded actuator 324 may be provided with a tubular element 3241 to which the gimbaled handle 34 is connectable and a hilt portion 3242. The tubular element 3241 rides along an inner frame 311 shaft, which is located in the central region 3111 and is connected to the first elastic element 3231.

The hilt portion 3242 includes two hilts that extend radially outwardly from the tubular element 3241 to abut with the latch elements 3211 when the first and second pivotable and spring-loaded gripping devices 321 are positioned in association with the module gripping element 32 assuming the module engaged closed position. That is, the two hilts of the hilt portion 3242 maintain the first and second pivotable and spring-loaded gripping devices 321 with the module gripping element 32 assuming the module engaged closed position against the bias applied by the second and third elastic elements 3232 and 3233 to the hinge-portion flanges. The first elastic element 3231 biases the spring-loaded actuator 324 toward a position in which the two hilts of the hilt portion 3242 are disposed to abut with the tab latch elements 3211.

However, when the spring-loaded actuator 324 is depressed against the bias of the first elastic element 3231, the two hilts of the hilt portion 3242 slip off of the latch elements 3211 and thus permit the first and second pivotable and spring-loaded gripping devices 321 to pivot about the hinge-portions 3212 and toward one another (i.e., inwardly) and to bring the module gripping element 32 into assumption of the module accepting open position due to the bias of the second and third elastic elements 3232 and 3233. That is, the spring-loaded actuator 324 is configured to cause or permit the module gripping element 32 to assume the open position from its assumption of the closed position when the spring-loaded actuator 324 is actuated.

Figure 3:
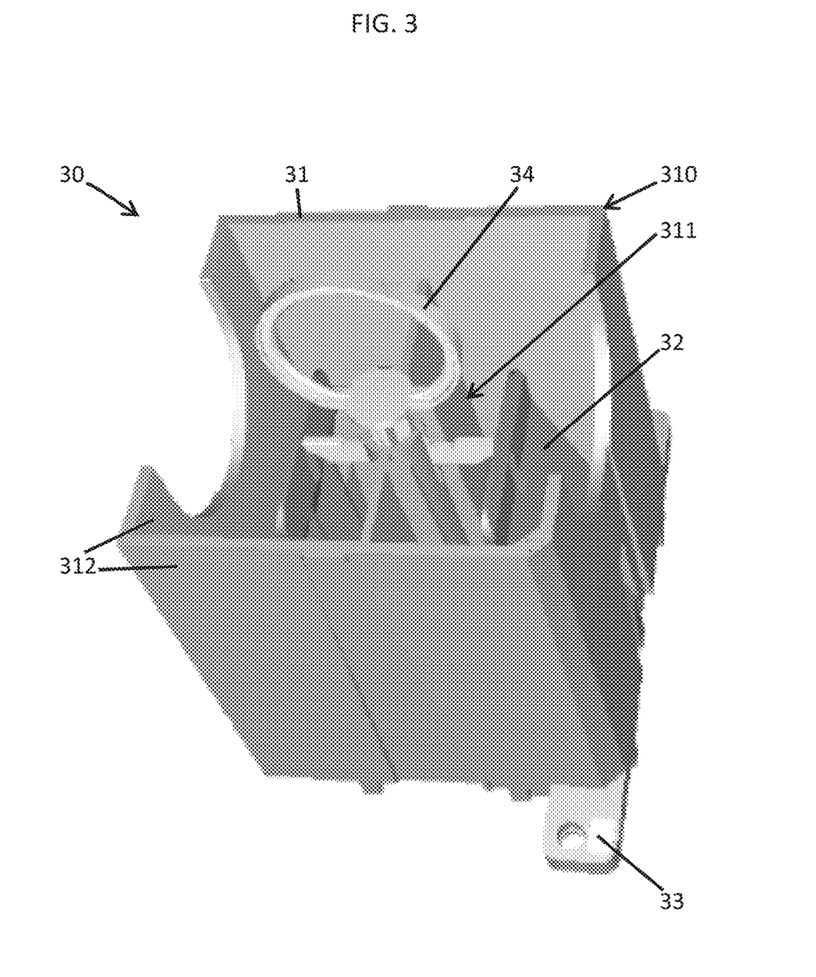
FIG. 3 is a perspective view of module placement apparatus in accordance with embodiments.
Figure 9:
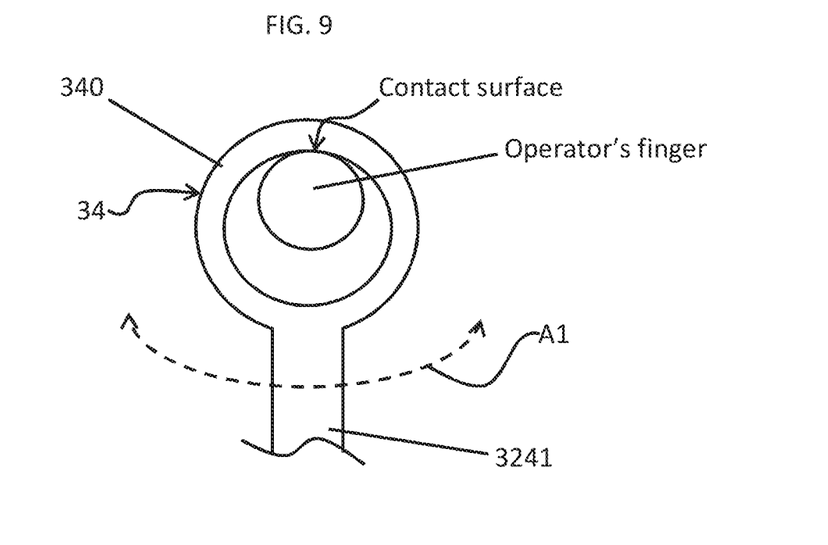
FIG. 9 is an enlarged view elevation view illustrating a pivoting action of the module placement apparatus of FIGS. 3-5.

As shown in the embodiments of FIGS. 3-5 and with additional reference to FIG. 9, the gimbaled handle 34 may include a ring element 340. The ring element 340 is connected to an upper end of the tubular element 3241 of the actuator 324 such that the frame 31 and the module placement tool 30 as a whole has at least one degree of self-centering freedom. That is, where an operator holds the module placement tool 30 above the alignment brackets 20 by inserting a finger into and through the aperture of the ring element 340 during the first insertion stage, the frame 31 and the module placement tool are pivotable in the direction illustrated by two-way arrow A1 about the contact surface defined by the upper portion of the operator's finger and the local lower surface of the ring element 340.

During an operation of the module placement apparatus 10 and for the embodiments of FIGS. 3-5 and 9, the operator executes the first insertion stage by maneuvering the frame 30 over the processor module 40 whereupon the operator depresses the actuator 324 to bring the module gripping element 32 into the module accepting open position. At this point, the operator manipulates the module gripping element 32 to cause the distal hook features of the hook portions 3213 to grip onto the complementary recessions defined in the upper portion 41 of the processor module 40 such that the processor module 40 is held by the module placement tool 30. Next, the operator lifts the module placement tool 30 (and the processor module 40) by inserting his finger into the ring element 340 and positions the module placement tool 30 over the alignment brackets 20. Simultaneously, the frame 31 and the module placement tool 30 pivot about the contact surface in a self-centering action (with the at least one degree of freedom) to thereby achieve the above-described parallel condition. Subsequently, the operator lowers the frame 31 toward the alignment brackets 20 such that the first and second guidance features 24 and 33 engage with the parallel condition continuously maintained. The first insertion stage ends upon such engagement, and the second insertion stage begins.

Figure 6:
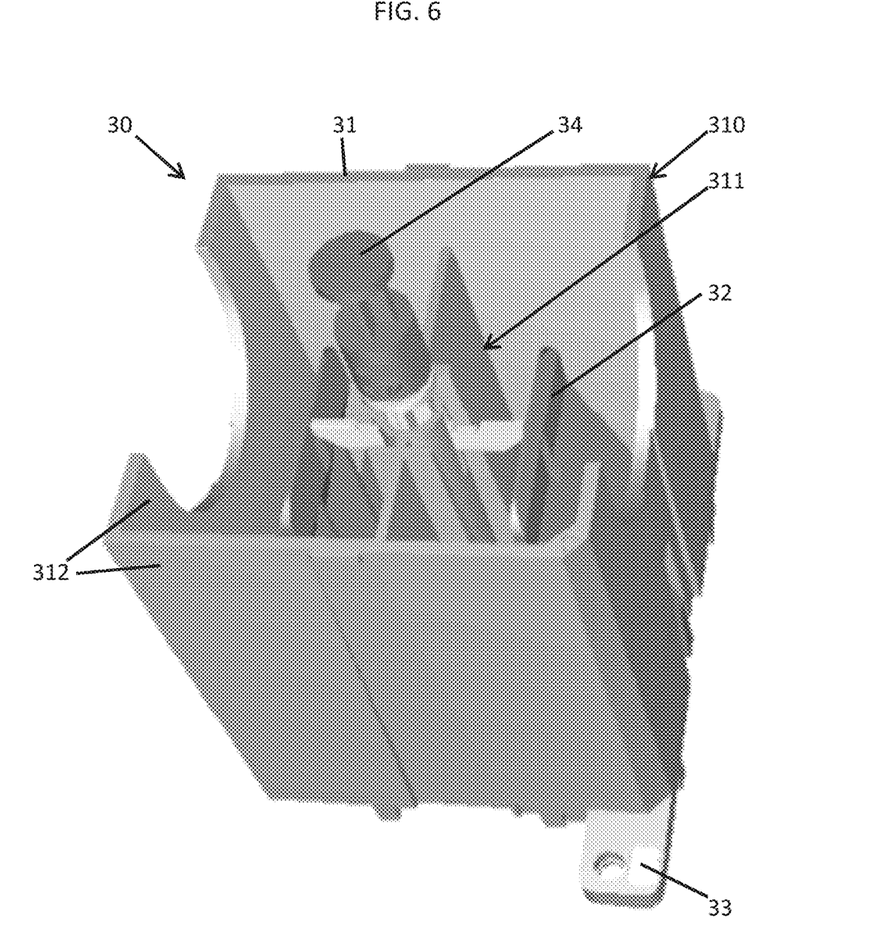
FIG. 6 is a perspective view of module placement apparatus in accordance with alternative embodiments.
Figure 10:
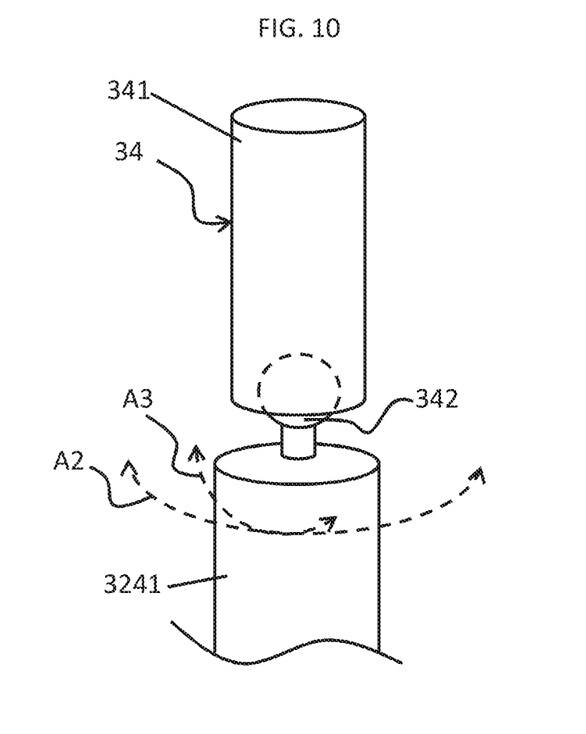
FIG. 10 is an enlarged view perspective view illustrating a pivoting action of the module placement apparatus of FIGS. 6-8.

As shown in the embodiments of FIGS. 6-8 and with additional reference to FIG. 10, the gimbaled handle 34 may include a pinch-grippable shaft 341 and a bearing 342, which is configured to connect the pinch-grippable shaft 341 to the upper end of the tubular element 3241 of the actuator 324 such that the frame 31 and the module placement tool 30 as a whole has at least two degrees of self-centering freedom. The pinch-grippable shaft 341 is formed to define an interior cavity and the bearing 342 includes a ball or bulbous element that is connected to the tubular element 3241 by a connector. This ball/bulbous element sits within the interior cavity and forms a contact surface defined by a lower surface thereof and an upper surface of the shaft wall facing inwardly into the interior cavity. That is, where an operator holds the module placement tool 30 above the alignment brackets 20 by pinch-gripping the pinch-grippable shaft 341 during the first insertion stage, the frame 31 and the module placement tool are pivotable in the transverse directions illustrated by two-way arrow A2 and two-way arrow A3 about the contact surface.

During an operation of the module placement apparatus 10 and for the embodiments of FIGS. 6-8 and 10, the operator executes the first insertion stage by maneuvering the frame 30 over the processor module 40 whereupon the operator depresses the actuator 324 to bring the module gripping element 32 into the module accepting open position. At this point, the operator manipulates the module gripping element 32 to cause the distal hook features of the hook portions 3213 to grip onto the complementary recessions defined in the upper portion 41 of the processor module 40 such that the processor module 40 is held by the module placement tool 30. Next, the operator lifts the module placement tool 30 (and the processor module 40) by pinch gripping the pinch-grippable shaft 341 and positions the module placement tool 30 over the alignment brackets 20. Simultaneously, the frame 31 and the module placement tool 30 pivot about the contact surface in a self-centering action (with the at least two degrees of freedom) to thereby achieve the above-described parallel condition. Subsequently, the operator lowers the frame 31 toward the alignment brackets 20 such that the first and second guidance features 24 and 33 engage with the parallel condition continuously maintained. The first insertion stage ends upon such engagement, and the second insertion stage begins.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A module placement apparatus, comprising:
   alignment brackets including first guidance features, the alignment brackets defining an interior and being disposable aside an array of contacts of a land grid array (LGA) interposer, wherein the array of contacts extend along a plane from which the first guidance features extend upwardly; and
   a module placement tool insertible into the interior and comprising:
   a frame;
   a module gripping element operably supported on the frame;
   second guidance features engageable with the first guidance features to maintain a relative orientation of the array of contacts of the LGA interposer and the frame; and
   a gimbaled handle coupled to the module gripping element to maintain the relative orientation until the second guidance features engage the first guidance features,
   wherein the module gripping element comprises:
   gripping devices, which are respectively actuatable to assume respective module accepting open positions and module engaged closed positions;
   a first elastic element;
   second and third elastic elements disposed to bias the gripping devices toward the respective open positions; and
   an actuator to which the gimbaled handle is connected, the actuator comprising a tubular element and hilts extending outwardly from the tubular element and being:
   disposable such that the hilts maintain the gripping devices in the respective closed positions against elastic element bias applied to the gripping devices by the second and third elastic elements, and actuatable against elastic element bias applied to the actuator by the first elastic element to cause gripping devices to slip off the hilts whereupon the gripping devices assume the respective open positions from the respective closed positions.

2. The module placement apparatus according to claim 1, wherein a lower surface of the frame and the array of contacts of the LGA interposer are respectively disposable such that a processor module is interposable between the lower surface of the frame and the array of contacts of the LGA interposer.

3. The module placement apparatus according to claim 2, wherein the processor module comprises electrical contacts respectively connectable with corresponding ones of the array of contacts of the LGA interposer.

4. The module placement apparatus according to claim 2, wherein the relative orientation is characterized in that the lower surface of the frame is parallel with the plane of the array of contacts of the LGA interposer.

5. The module placement apparatus according to claim 1, wherein the frame comprises an outer frame and an inner frame, which is disposed within the outer frame to be supportive of the module gripping element.

6. The module placement apparatus according to claim 1, wherein the gimbaled handle comprises a ring connected to the module gripping element such that the frame has at least one degree of self-centering freedom.

7. A module placement apparatus, comprising:

alignment brackets including first guidance features, the alignment brackets defining an interior and being disposable aside an array of contacts of a land grid array (LGA) interposer, wherein the array of contacts extend along a plane from which the first guidance features extend upwardly; and a module placement tool insertible into the interior and comprising:

a frame;

a module gripping element operably supported on the frame;

second guidance features engageable with the first guidance features to maintain a relative orientation of the array of contacts of the LGA interposer and the frame; and a ring-shaped gimbaled handle coupled to the module gripping element to provide the frame with at least one degree of self-centering freedom for maintaining the relative orientation until the second guidance features engage the first guidance features, wherein the module gripping element comprises:

gripping devices, which are respectively actuatable to assume respective module accepting open positions and module engaged closed positions;

a first elastic element;

second and third elastic elements respectively disposed to bias the gripping devices toward the respective open positions; and an actuator to which the ring-shaped gimbaled handle is connected, the actuator comprising a tubular element and hilts extending outwardly from the tubular element and being:

disposable such that the hilts maintain the gripping devices in the respective closed positions against elastic element bias applied to the gripping devices by the second and third elastic elements, and actuatable against elastic element bias applied to the actuator by the first elastic element to cause gripping devices to slip off the hilts whereupon the gripping devices assume the respective open positions from the respective closed positions.

8. The module placement apparatus according to claim 7, wherein a lower surface of the frame and the array of contacts of the LGA interposer are respectively disposable such that a processor module is interposable between the lower surface of the frame and the array of contacts of the LGA interposer, wherein the relative orientation is characterized in that the lower surface of the frame is parallel with the plane of the array of contacts of the LGA interposer.

9. The module placement apparatus according to claim 7, wherein the frame comprises an outer frame and an inner frame, which is disposed within the outer frame to be supportive of the module gripping element.

* * * * *